US009940866B2

(12) United States Patent
Lin et al.

(10) Patent No.: US 9,940,866 B2
(45) Date of Patent: Apr. 10, 2018

(54) ELECTRONIC DEVICE HAVING DISPLAY WITH CURVED EDGES

(71) Applicant: Apple Inc., Cupertino, CA (US)

(72) Inventors: Chin-Wei Lin, Cupertino, CA (US); Zhen Zhang, San Jose, CA (US); Shih Chang Chang, Cupertino, CA (US); Sang Ha Kim, Dublin, CA (US)

(73) Assignee: Apple Inc., Cupertino, CA (US)

( * ) Notice: Subject to any disclaimer, the term of this patent is extended or adjusted under 35 U.S.C. 154(b) by 149 days.

(21) Appl. No.: 14/978,988

(22) Filed: Dec. 22, 2015

(65) Prior Publication Data

US 2016/0351098 A1 Dec. 1, 2016

Related U.S. Application Data

(60) Provisional application No. 62/169,453, filed on Jun. 1, 2015.

(51) Int. Cl.
*G09G 3/20* (2006.01)
*G02F 1/1345* (2006.01)
*G09G 3/36* (2006.01)

(52) U.S. Cl.
CPC ......... *G09G 3/2092* (2013.01); *G02F 1/1345* (2013.01); *G09G 3/20* (2013.01); *G09G 3/3666* (2013.01); *G02F 2201/56* (2013.01); *G09G 2300/0426* (2013.01); *G09G 2300/0439* (2013.01); *G09G 2300/08* (2013.01); *G09G 2310/0221* (2013.01); *G09G 2310/0264* (2013.01); *G09G 2310/0281* (2013.01); *G09G 2310/0286* (2013.01)

(58) Field of Classification Search
CPC .......... G02F 1/1345; G09G 2310/0281; G09G 2310/0286; G09G 3/3666; H01L 27/124; H01L 2021/775
See application file for complete search history.

(56) References Cited

U.S. PATENT DOCUMENTS 8,599,351 B2    12/2013  Kim
2008/0012794 A1*  1/2008  Battersby ............... G02F 1/1345
                                              345/55

(Continued)

FOREIGN PATENT DOCUMENTS

CN         1952764        7/2010
KR       20080044434      5/2008
(Continued)

*Primary Examiner* — Gerald Johnson
(74) *Attorney, Agent, or Firm* — Treyz Law Group, P.C.; G. Victor Treyz; David K. Cole (57) ABSTRACT

A display may have an array of pixels. The array of pixels may have a shape such as a circular shape or other shape with a curved edge. Display driver circuitry may supply data signals to the pixels using folded vertical data lines and bisected horizontal gate lines. Each folded vertical lines may have a first segment in a left half of the array and a second segment in a right half of the display. Curved coupling segments in an inactive area of the display may be used in joining the first and second segments. Display driver circuits may be provided in top and bottom portions of the inactive area to supply data to respective top and bottom portions of the array. Gate driver output buffers may have different strengths in different rows of the array.

15 Claims, 9 Drawing Sheets

(56) References Cited

U.S. PATENT DOCUMENTS

| | | |
|---|---|---|
| 2008/0266210 A1 | 10/2008 | Nonaka |
| 2009/0102758 A1* | 4/2009 | Anzai .................. G09G 3/3225 345/76 |
| 2009/0115933 A1 | 5/2009 | Mimur |
| 2010/0134743 A1* | 6/2010 | Shin .......................... G02F 1/13 349/143 |
| 2010/0141570 A1 | 6/2010 | Horiuchi et al. |
| 2010/0156945 A1* | 6/2010 | Yoshida ................ G02F 1/1345 345/690 |
| 2010/0289994 A1* | 11/2010 | Nonaka ............. G02F 1/133514 349/108 |
| 2012/0001835 A1 | 1/2012 | Yamamoto et al. |
| 2014/0049500 A1 | 2/2014 | Chen et al. |
| 2014/0253419 A1 | 9/2014 | Tanada |
| 2015/0267117 A1 | 9/2015 | Kim et al. |
| 2015/0355487 A1 | 12/2015 | Emmert et al. |
| 2016/0190166 A1* | 6/2016 | Kim ..................... H01L 27/124 257/71 |
| 2016/0240141 A1* | 8/2016 | Lee ..................... G02F 1/13454 |
| 2016/0275910 A1* | 9/2016 | Lee ..................... G09G 3/3225 |
| 2016/0291376 A1* | 10/2016 | Iwatsu .............. G02F 1/133512 |

FOREIGN PATENT DOCUMENTS

| | | |
|---|---|---|
| KR | 101562097 | 10/2015 |
| WO | 2015023804 | 2/2015 |

* cited by examiner

ELECTRONIC DEVICE HAVING DISPLAY WITH CURVED EDGES

This application claims the benefit of provisional patent application No. 62/169,453, filed Jun. 1, 2015, which is hereby incorporated by reference herein in its entirety.

BACKGROUND

This relates generally to displays, and, more particularly, to displays with curved edges.

Electronic devices such as cellular telephones, computers, and wristwatch devices often include displays. Display driver circuitry is used to apply control signals to an array of pixels in a display. The array of pixels is used to display images for a user.

Pixel arrays generally have rectangular shapes and include rows and columns of pixels controlled by vertical and horizontal signal lines. Data lines that extend vertically through an array distribute data signals to the pixels. Gate lines that extend horizontally through the array are used to provide control signals to the pixels of each row.

Pixel arrays often have rectangular shapes. However, rectangular pixel arrays will not fit efficiently within a device having a circular shape. Circular displays can have bottleneck regions in which signal lines become crowded, leading to inefficient use of display area.

It would therefore be desirable to be able to provide improved displays such as circular displays or other displays with curved edges.

SUMMARY

An electronic device may have a display. The display may have an array of pixels. The array may have rows and columns of pixels that form an active area for the display. The active area may have a curved edge and may have a circular shape. A circular ring-shaped inactive area may surround the circular active area of the display. Display driver circuitry may overlap the inactive area. For example, curved strips of gate driver circuitry may run along left and right portions of the inactive area.

Display driver circuitry may supply data signals to the pixels using folded vertical data lines. Each folded vertical lines may have a first segment in a left half of the array and a second segment in a right half of the display. Horizontal gate lines may run across the vertical data lines. The horizontal gate lines may be bisected to form left and right isolated segments in each row of the array. The gate driver circuitry may include gate driver circuitry in the left portion of the inactive area that supplies gate line signals to the left segments so that the segments of the folded data lines in the left half of the array can supply data to the pixels in the left half of the array. The gate driver circuitry may also include gate driver circuitry in the right portion of the inactive area that supplies gate lines signals to the right segments so that the segments of the folded data lines in the right half of the array can supply data to the pixels in the right half of the array. Curved coupling segments of the data lines that lie in the inactive area of the display may be used in joining the first and second segments of each data line. Gate driver output buffers may have different strengths in different rows of the array.

An electronic device may have portions that bend or may include flexible printed circuits that are bent. Serpentine lines may be used to convey display signals to and from display driver circuitry in the device. The serpentine lines may overlap a bent portion of a flexible printed circuit or other bent substrate in a display.

Display driver circuits may be provided in top and bottom portions of the inactive area of a display to supply data to respective top and bottom portions of an array of pixels in the display. By spreading out the data line paths between the top and bottom portions of the inactive area, signal line crowding can be reduced.

DETAILED DESCRIPTION

Figure 1:
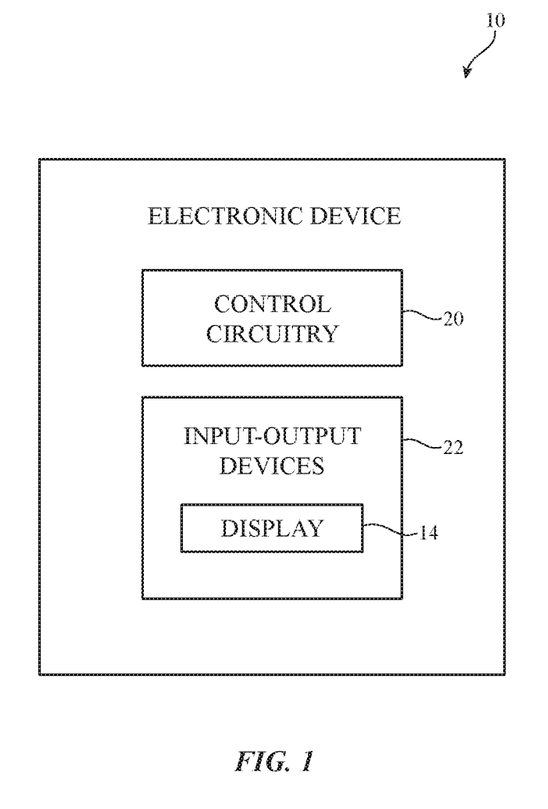
FIG. 1 is a schematic diagram of an illustrative electronic device having a display in accordance with an embodiment.

Electronic devices may be provided with displays. The displays may have circular shapes or other shapes with curved edges. A schematic diagram of an illustrative electronic device with a display is shown in FIG. 1. Device 10 of FIG. 1 may be a computing device such as a laptop computer, a computer monitor containing an embedded computer, a tablet computer, a cellular telephone, a media player, or other handheld or portable electronic device, a smaller device such as a wrist-watch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 20. Control circuitry 20 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 20 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 22 may be used to allow data to be supplied to device 10 and to allow data to be provided from device 10 to external devices. Input-output devices 22 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 22 and may receive status information and other output from device 10 using the output resources of input-output devices 22.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be a liquid crystal display, an organic light-emitting diode display, an electrophoretic display, an electrowetting display, a display formed from an array of discrete light-emitting diodes formed from crystalline semiconductor die, or any other suitable type of display. Configurations in which display 14 is circular or has at least one curved edge are sometimes described herein as an example. This is, however, merely illustrative. Any suitable type of display may be used for device 10, if desired.

Figure 2:
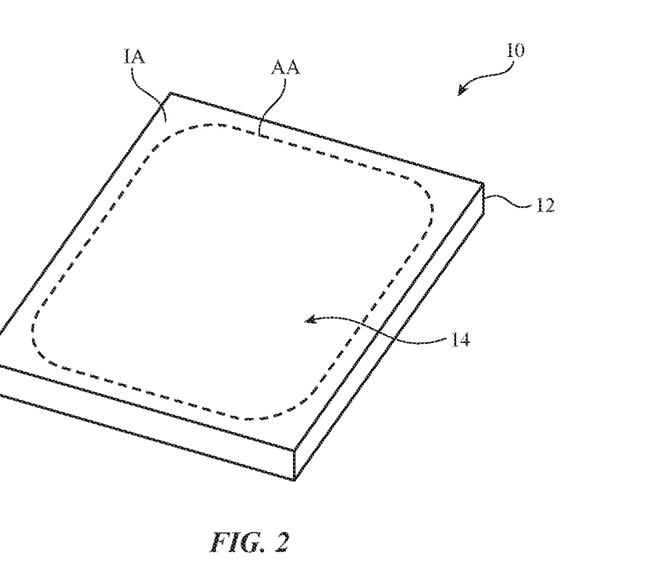
FIG. 2 is a perspective view of an illustrative electronic device having a display in accordance with an embodiment.

A perspective view of an illustrative electronic device having a display is shown in FIG. 2. As shown in FIG. 2, device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be mounted in housing 12. Active area AA of display 14 may contain pixels that emit light to form images for viewing by a user. Inactive border area IA does not contain light-emitting pixels. Inactive border area IA may have opaque masking structures (e.g., a layer of black ink or other opaque masking material on the inner surface of a display cover layer or other outer display layer), opaque bezel structures or other opaque structures that prevent light from passing through inactive area IA. Because inactive area IA does not produce images, display driver circuitry, interconnect lines, and other supporting circuitry for display 14 may be formed in inactive area IA and may be hidden from view by the opaque structures of inactive area IA.

Figure 3:
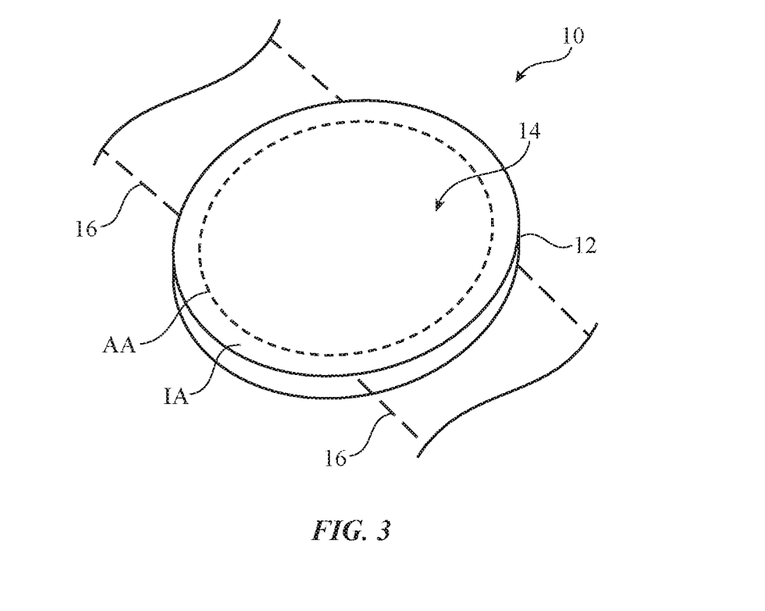
FIG. 3 is a perspective view of an illustrative electronic device having a circular display in accordance with an embodiment.

In the example of FIG. 2, display 14 has an active area AA with four edges and four curved (rounded) corners. Other display shapes with one or more curved edges may be used in forming display 14, if desired. In the illustrative configuration for device 10 of FIG. 3, active area AA of display 14 is circular and is surrounded by a ring-shaped inactive area IA. Display 14 of FIG. 3 is mounted in a housing (housing 12) with a circular footprint. Straps such as straps 16 may be attached to housing 12 of FIG. 3 (or other housings such as illustrative rectangular housing 12 of FIG. 2) to support attachment of device 10 to the wrist of a user (as an example).

Figure 4:
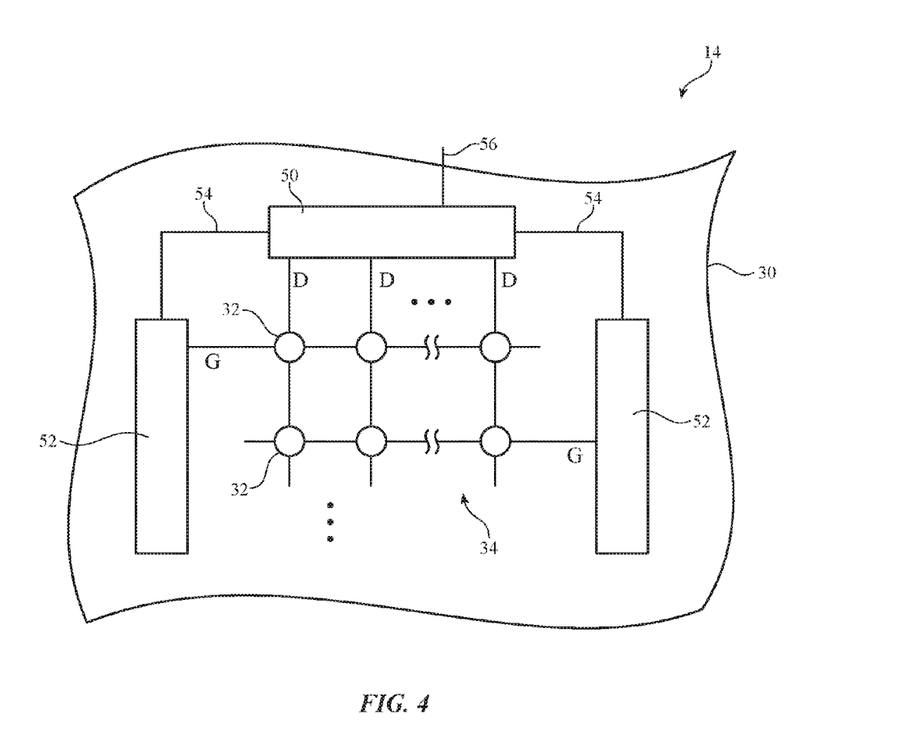
FIG. 4 is a diagram of an illustrative array of pixels for a display in accordance with an embodiment.

FIG. 4 is a diagram of an illustrative display. As shown in FIG. 4, display 14 may include layers such as substrate layer 30. Substrate layers such as layer 30 may be formed from planar circular layers of material or layers of material with other shapes (e.g., shapes with one or more curved edges). The substrate layers of display 14 may include glass layers, polymer layers, composite films that include polymer and inorganic materials, metallic foils, etc.

Display 14 may have an array of pixels 32 for displaying images for a user such as pixel array 34. Pixels 32 in array 34 may be arranged in rows and columns. The edges of array 34 may be curved (i.e., each row of pixels 32 and/or each column of pixels 32 in array 34 may have a different length). There may be any suitable number of rows and columns in array 34 (e.g., ten or more, one hundred or more, or one thousand or more, etc.). Display 14 may include pixels 32 of different colors. As an example, display 14 may include red pixels, green pixels, and blue pixels. If desired, a backlight unit may provide backlight illumination for display 14.

Display driver circuitry may be used to control the operation of pixels 34. The display driver circuitry may be formed from integrated circuits, thin-film transistor circuits, or other suitable circuitry. The display driver circuitry of FIG. 4 includes display driver circuitry 50 and additional display driver circuitry such as gate driver circuitry 52. Gate driver circuitry 52 may be formed along one or more edges of display 14. For example, gate driver circuitry 52 may be arranged along the left and right sides of display 14 as shown in FIG. 4.

As shown in FIG. 4, display driver circuitry 50 (e.g., one or more display driver integrated circuits, thin-film transistor circuitry, etc.) may contain communications circuitry for communicating with system control circuitry over signal path 56. Path 56 may be formed from traces on a flexible printed circuit or other cable. The control circuitry may be located on one or more printed circuits in electronic device 10. During operation, the control circuitry (e.g., control circuitry 20 of FIG. 1) may supply circuitry such as a display driver integrated circuit in circuitry 50 with image data for images to be displayed on display 14. Display driver circuitry 50 of FIG. 4 is located at the top of display 14. This is merely illustrative. Display driver circuitry 50 may be located at both the top and bottom of display 14 or in other portions of device 10.

To display the images on pixels 32, display driver circuitry 50 may supply corresponding image data to data lines D while issuing control signals to supporting display driver circuitry such as gate driver circuitry 52 over signal paths

54. With the illustrative arrangement of FIG. 2, data lines D run vertically through display 14 and are associated with respective columns of pixels 32.

Gate driver circuitry 52 (sometimes referred to as gate line driver circuitry or horizontal control signal circuitry) may be implemented using one or more integrated circuits and/or may be implemented using thin-film transistor circuitry on substrate 30. Horizontal control lines G (sometimes referred to as gate lines, scan lines, emission control lines, etc.) run horizontally through display 14. Each gate line G is associated with a respective row of pixels 32. If desired, there may be multiple horizontal control lines such as gate lines G associated with each row of pixels. The configuration of FIG. 4 in which each gate line G is associated with a respective row of pixels 32 is merely illustrative.

Gate driver circuitry 52 may assert control signals on the gate lines G in display 14. For example, gate driver circuitry 26 may receive clock signals and other control signals from circuitry 50 and may, in response to the received signals, assert a gate line signal on gate lines G in sequence, starting with the gate line signal G in the first row of pixels 32 in array 34. As each gate line is asserted, data from data lines D may be loaded into a corresponding row of pixels. In this way, control circuitry such as display driver circuitry 50 and 52 may provide pixels 32 with signals that direct pixels 32 to display a desired image on display 14.

To help minimize the width of inactive border area IA, it may be desirable to use a data line layout for display 14 in which data lines are folded back on themselves. With this type of arrangement, data lines D each pass multiple times (e.g., two times) through array 34. Because each data line passes through two columns of pixels, the number of data lines in display 14 is minimized and the amount of space needed to interconnect the data lines in array 34 to display driver circuitry 50 within inactive area IA is minimized (particularly in potential bottleneck areas adjacent to display driver circuitry 50).

Figure 5:
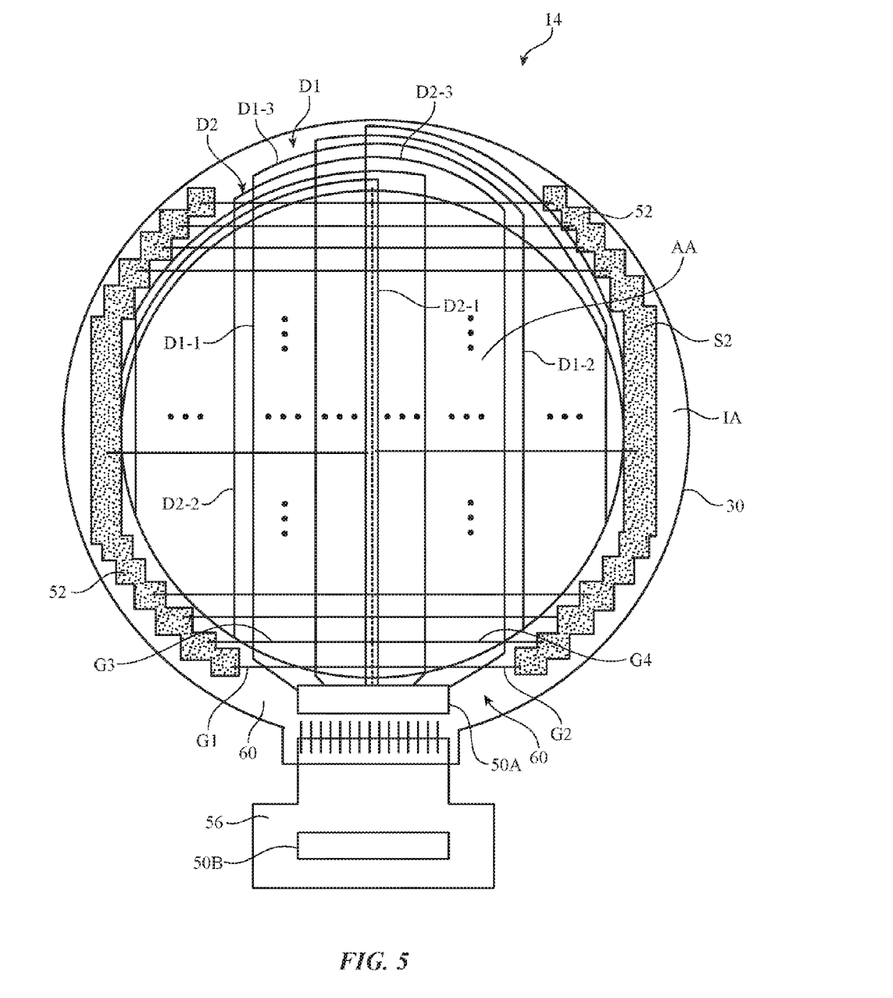
FIG. 5 is a top view of an illustrative display in accordance with an embodiment.

A display with folded data lines that help reduce signal line crowding in this way is shown in FIG. 5. As shown in FIG. 5, display 14 may have substrate layers such as layer 30 with a circular outline (e.g., with a circular periphery) and/or with other shapes that have one or more curved edges. Display driver circuitry 50 may be implemented using thin-film transistor circuitry and/or integrated circuit(s) on substrate 30 and/or on flexible printed circuit 56. Gate driver circuitry 52 may be located in inactive area IA. Pixels 32 (FIG. 4) may be located in active area AA.

The data lines in display 14 run vertically through the pixels in active area AA. In the example of FIG. 5, each data line passes twice through the pixels of active area AA. For example, data line D1 has a first portion such as segment D1-1 that passes vertically upward (in the orientation of FIG. 5) through the pixels of active area AA and a second portion such as segment D1-2 that passes vertically downward (in the orientation of FIG. 5) through the pixels of active area AA. Segments D1-1 and D1-2 may pass through different respective halves of active area AA. Data line D1 also has a portion such as segment D1-3 (i.e., a curved coupling segment) in inactive area IA that couples data line portion D1-1 to data line portion D1-2. As another example, data line D2 (which starts near the center of display 14 and which folds back on itself to the left) has first portion D2-1 and second portion D2-2 that are coupled by portion D2-3 in inactive area IA. Because data lines D in display 14 such as illustrative data lines D1 and D2 each fold back on themselves, fewer data lines (half as many) are present in potential bottleneck regions in active area IA (e.g., portions of inactive area IA near display driver circuitry 50A such as regions 60).

The gate line conductor in each row of pixels may be bisected to ensure that all pixels 32 in array 34 can be addressed (i.e., to ensure that each pixel can be independently loaded with a desired data value). The left half of each gate line conductor overlaps one half of the folded data line (e.g., the half of the data line in the left half of area AA) and the right half of each gate line conductor in the same row overlaps the other half of the folded data line (i.e., the half of the data line in the right half of area AA).

To accommodate the curved shape of the peripheral edge of substrate 30, the gate lines G in display 14 may be shorter near the upper and lower edges of display 14 and may be longer near the middle of display 14. Gate lines G may be provided with gate line signals from gate driver circuitry 52. With one illustrative arrangement, gate driver circuits on the left and right sides of display 14 assert gate line signals G in an alternating fashion on the left and right gate lines segments of each gate line conductor. For example, gate lines signals may be asserted on gate line segment G1 on the left of display 14, gate line segment G2 in the same row of pixels on the right side of display 14, gate line segment G3 on the left of display 14 in a subsequent row of pixels, gate line segment G4 in the same row of pixels on the right side of display 14, and so forth. Other patterns may be used when asserting gate line signals, if desired.

Figure 6:
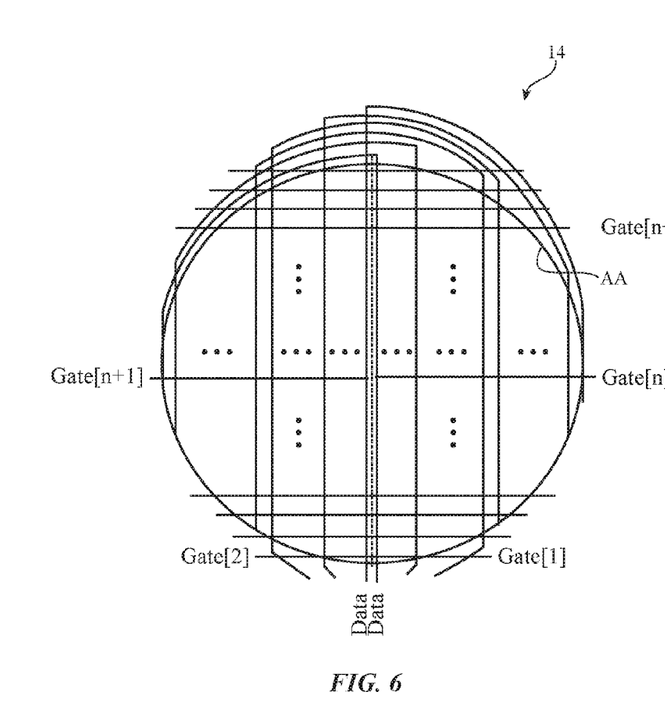
FIG. 6 is a top view of an illustrative pattern of gate lines and data lines that may be used in a display in accordance with an embodiment.
Figure 7:
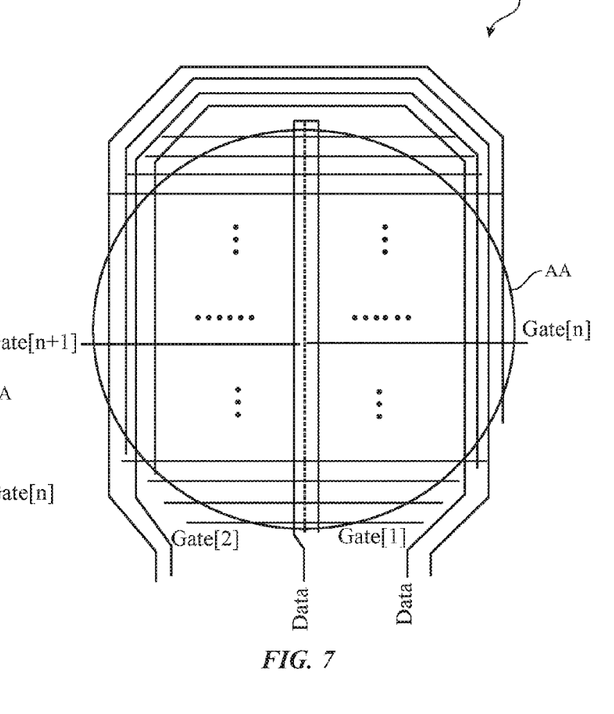
FIG. 7 is a top view of another illustrative pattern of gate lines and data lines that may be used in a display in accordance with an embodiment.

FIG. 6 is a diagram showing how gate lines in each row may be divided into a left half (Gate[2] . . . Gate[n+1]) and a corresponding right half (Gate[1] . . . Gate[n]). In the arrangement of FIG. 6, the portions of the data lines that extend vertically upward through the display have different lengths than the corresponding folded segments of the same data lines that extend vertically downwards through the display. This may create uneven data lines with different lengths and therefore different amounts of loading. If desired, folded data lines may be arranged in display 14 so that the first and second parallel vertical segments of each folded data line are equal in length (i.e., so that the segments that extend upwards have the same length as the segments that extend downwards, as shown in FIG. 7). The arrangement of FIG. 7 may help ensure that all data lines experience the same amount of loading.

Figure 8:
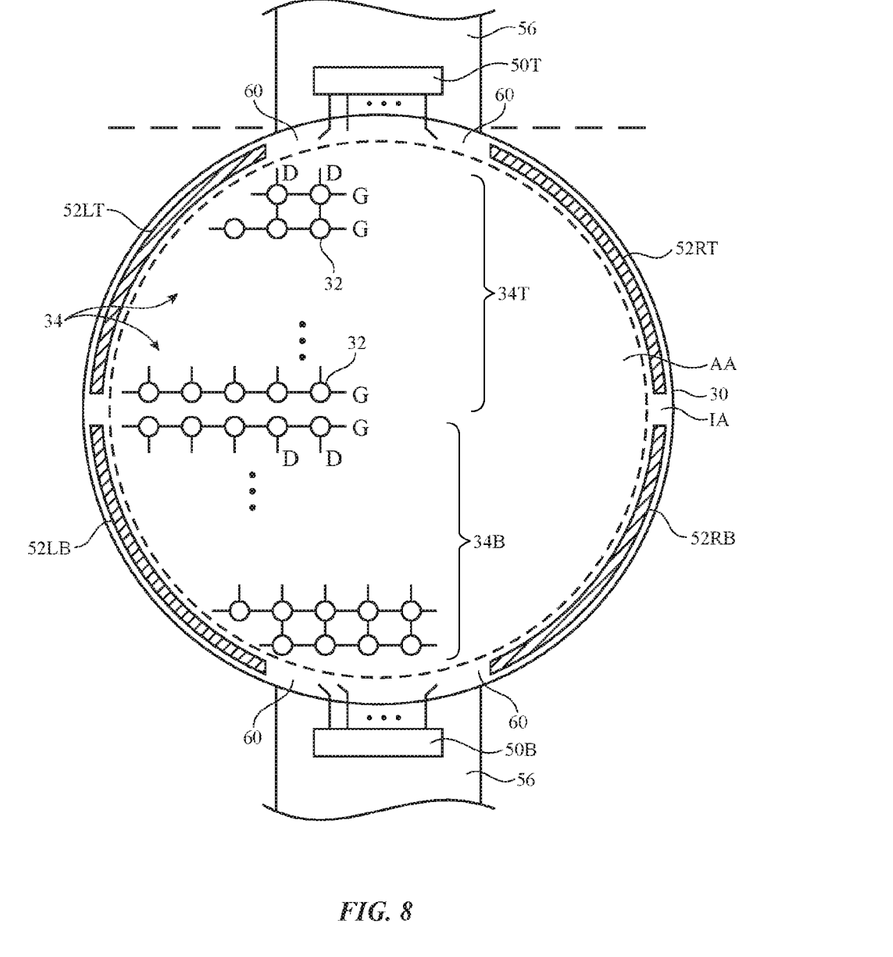
FIG. 8 is a top view of an illustrative electronic device having a display in accordance with an embodiment.

If desired, the number of data lines that traverse potential bottleneck regions 60 may be minimized by supplying data signals to the pixels of display 14 using display driver circuitry that is located on the top and bottom of display 14. This type of arrangement is shown in FIG. 8. As shown in FIG. 8, pixels 32 in array 34 may be arranged in an upper half array (upper array portion 34T) and a lower half array (lower array portion 34B). Gate driver circuitry 52LT on the left of upper array portion 34T and gate driver circuitry 52RT on the right of upper array portion 34T may be coupled to the gate lines G in upper array portion 34T. Gate driver circuitry 52LB on the left of lower array portion 34B and gate driver circuitry 52RB on the right of lower array portion 34B may be coupled to the gate lines in lower array portion 34B. Display driver circuitry 50T, which is located along the top portion of display 14, may be used to supply data signals to data lines D in upper array portion 34T and may supply control signals to gate driver circuitry 52LT and 52RT. Gate driver circuits 52LT and 52RT may respectively handle odd and even gate lines G in upper array portion 34T. Display driver circuitry 50B, which is located adjacent to lower array portion 34B along the lower edge of display 14, may be used to supply data signals to data lines D in lower array portion 34B and may supply control signals to gate driver circuitry 52LB and 52RB. Gate driver circuits 52LB and 52RB may respectively handle odd and even gate lines G in lower array portion 34B.

If desired, the data lines in upper array portion 34T may be folded and the gate lines G in upper array portion 34T may be segmented into left and right halves handled by circuits 52LT and 52RT, respectively. The lower portion of display 14 may also use folded data lines and segmented gate lines if desired.

Figure 9:
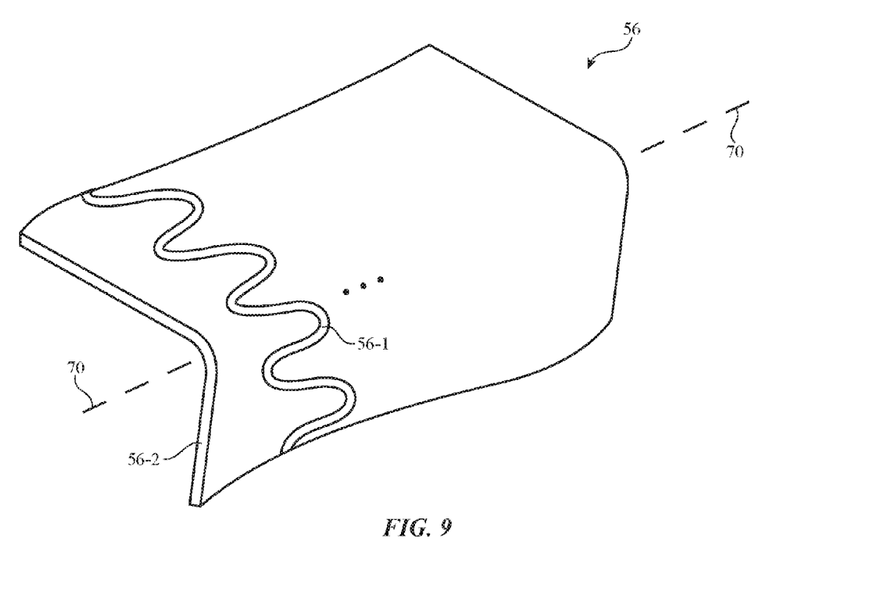
FIG. 9 is a perspective view of an illustrative bent substrate having traces that resist cracking in accordance with an embodiment.

FIG. 9 is a perspective view of a portion of flexible printed circuit 56 showing how printed circuit 56 may include metal signal traces 56-1 and flexible polymer substrate 56-2. Flexible printed circuit 56 may bend about bend axis 70 during use of display 14 in device 10. Portions of flexible printed circuit 56 may, for example, extend between housing 12 and strap 16, which may allow flexible printed circuit 56 to bend as strap 16 is wrapped around the wrist of a user or it be desirable to bend flexible printed circuit 56 (by 90° or 180° or more) to accommodate mounting of flexible printed 56 within device 10 (whether or not portions of flexible printed circuit 56 extend into straps 16).

Flexible printed circuit 56 may have one or more layers of substrate material and/or encapsulant layers to help reduce stress in metal traces 56-1 (e.g., to adjust the location of the neutral stress plane for printed circuit 56 to lie within traces 56-1). Traces 56-1 may also have serpentine shapes or other shapes that help enhance trace flexibility and reduce the likelihood of cracking during bending. Traces such as traces 56-1 may have a pitch of 20-25 microns, 10-50 microns, more than 10 microns, less than 30 microns, etc. The minimum spacing between adjacent traces 56-1 may be 2-5 microns, more than 1 micron, less than 10 microns, etc. The wavelength of each trace 56-1 may be about 30-50 microns, less than 60 microns, more than 20 microns, or other suitable wavelength and each trace may have curved portions characterized by a circular radius of 5-10 microns, more than 4 microns, less than 15 microns, etc. The width of each trace 56-1 may be about 3-8 microns, more than 2 microns, less than 10 microns, etc.

Figure 10:
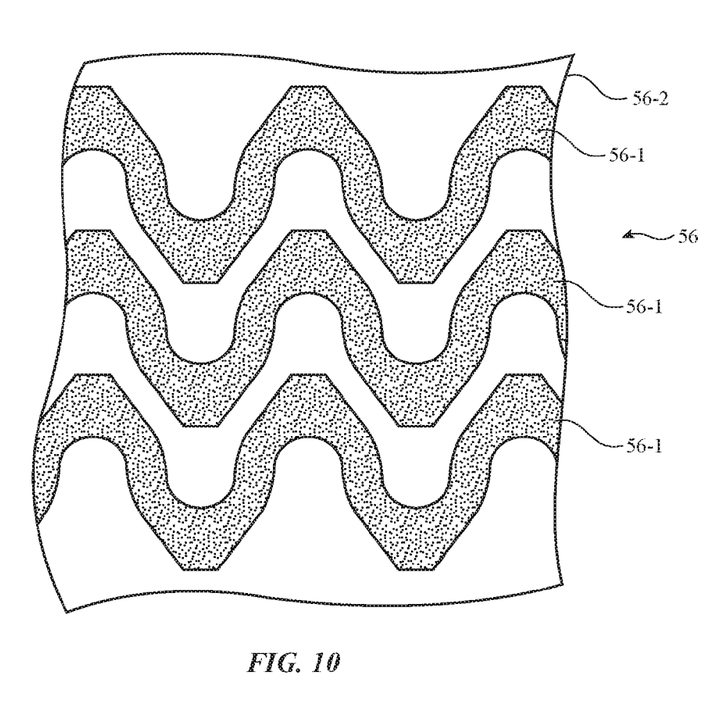
FIG. 10 is a top view of an illustrative set of serpentine traces that resist cracking when bent in accordance with an embodiment.
Figure 11:
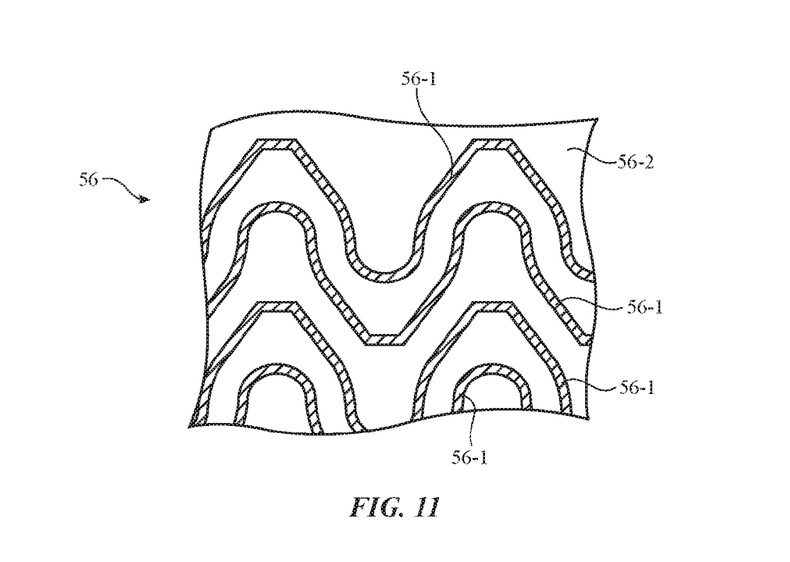
FIG. 11 is a top view of another illustrative set of serpentine traces that resist cracking when bent in accordance with an embodiment.

FIGS. 10 and 11 show illustrative patterns that may be used for traces 56-1 on substrate 56-2. In the arrangement of FIG. 10, traces 56-1 follow sinewave-like meandering paths. In the arrangement of FIG. 11, traces 56-1 each have a series of straight segments and semicircular segments. Other layouts may be used for traces 56-1 if desired. The configurations of FIGS. 9, 10, and 11 are merely illustrative.

Figure 12:
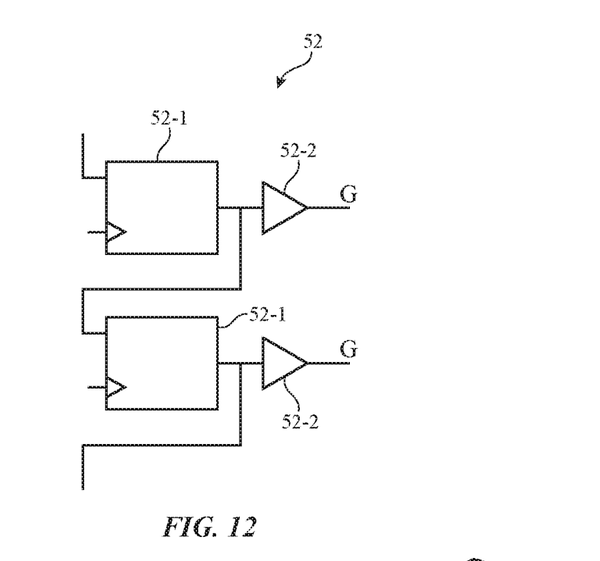
FIG. 12 is a diagram of illustrative gate driver circuitry in accordance with an embodiment.

FIG. 12 is a circuit diagram of gate driver circuitry 52. Gate driver circuitry 52 may have the shape of a curved strip of circuitry in inactive area IA that follows the curved edge of array 34. Circuitry 52 may include shift register circuitry formed from a chain of registers such as registers 52-1. The output of each register may serve both as a gate line signal for a corresponding gate line G and as a trigger signal for a subsequent register in the chain of registers. Output drivers 52-2 (sometimes referred to as output buffers) may be used to strengthen the output of each register and to apply the strengthened version of the register output to a corresponding gate line G.

The rise and fall times of the gate line signals on gate lines G will tend to be lengthened with increasing gate line length and will tend to be decreased with increasing output driver size. Gate line loading effects (which cause rise and fall times to be extended) increase with increasing gate line length, so longer rows in array 34 that experience more loading than shorter rows will experience lengthened gate line signal rise and fall times. To compensate for the additional loading experienced when asserting gate line signals in longer rows, the strength of output drivers 52-2 can be progressively increased as a function of increasing gate line length. This type of arrangement is shown in FIG. 13.

Figure 13:
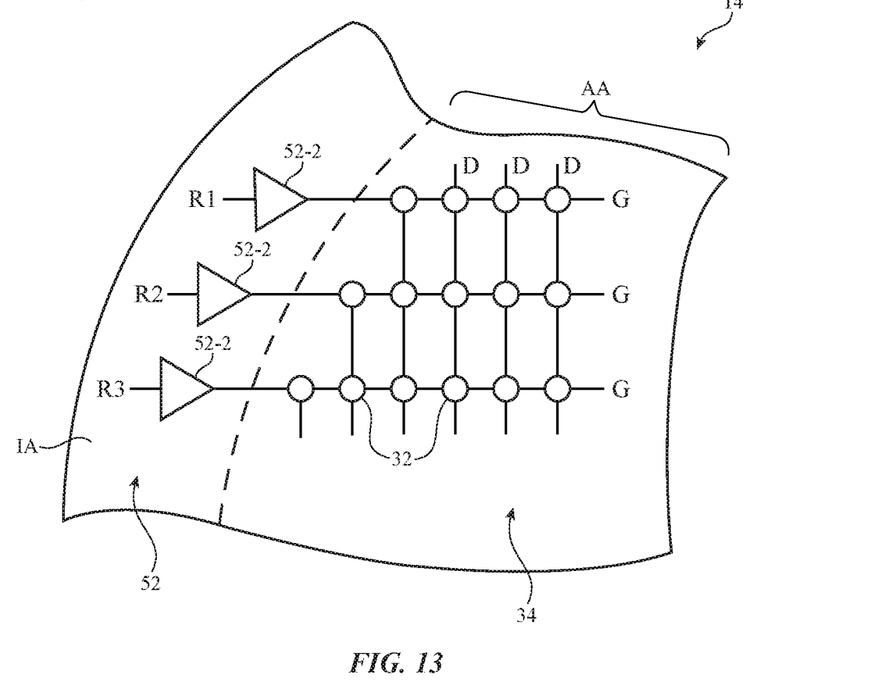
FIG. 13 is a diagram of illustrative gate driver circuitry with output buffers that increase in size as a function of increasing row size in a display in accordance with an embodiment.

As shown in the example of FIG. 13, gate driver circuitry 52 includes multiple gate line drivers 52-2. The strength of the driver in row R2, which has a longer gate line than row R1 is greater than the strength of the driver in row R1. Similarly, the strength of the driver in row R3, which has a gate line that is longer than the gate line in row R2 is larger than the strength of the driver in row R2. By using correspondingly larger output buffers 52-2 for longer (more heavily loaded) gate lines G, the gate line signals on all gate lines may be made to have substantially similar shapes (e.g., the rise and fall times will all be satisfactory even in displays with curved edges such as displays with circular pixel arrays 34).

The foregoing is merely illustrative and various modifications can be made by those skilled in the art without departing from the scope and spirit of the described embodiments. The foregoing embodiments may be implemented individually or in any combination.

What is claimed is:

1. A display, comprising:
    an array of pixels forming an active area for the display, wherein the array of pixels has at least one curved edge;
    an inactive area that surrounds the array of pixels and that has opposing top and bottom portions and opposing left and right portions; and
    display driver circuitry that includes first display driver circuitry in the top portion, second display driver circuitry in the bottom portion, and gate driver circuitry in the left and right portions, wherein the gate driver circuitry includes a first shift register in the left portion and a second shift register in the right portion.

2. The display defined in claim 1 further comprising first data lines with which the first display driver circuitry supplies a top half of the array of pixels with data and second data lines with which the second display driver circuitry supplies a lower half of the array of pixels with data.

3. The display defined in claim 2 further comprising control signal lines that run perpendicular to the first and second data lines.

4. The display defined in claim 3 wherein the first and second shift registers each have a chain of registers, wherein each of the registers has an output, and wherein the gate driver circuitry further comprises output drivers coupled between the outputs of the registers and the control signal lines.

5. The display defined in claim 4 wherein the control lines have different lengths in different rows of the array.

6. The display defined in claim 5 wherein at least some of the output drivers have different strengths.

7. The display defined in claim 6 wherein the control lines include at least a first control line and at least a second control line that is longer than the at least first control line, wherein the output drivers include at least a first output driver that supplies the control signals to the at least first control line and a second output driver that is stronger than the first output driver and that supplies the control signals to the at least second control line.

8. The display defined in claim 1 further comprising gate lines that supply gate line signals from the gate driver circuitry to rows of the pixels, wherein the rows of the pixels have different lengths and wherein the gate driver circuitry includes output drivers of different strengths that supply the gate lines signals to the rows of pixels of different lengths using the gate lines.

9. The display defined in claim 8 wherein the gate lines have different lengths.

10. A display, comprising:
an array of pixels forming an active area for the display with at least one curved edge, wherein the active area is circular, wherein the active area of the display is surrounded by an inactive area without any pixels, wherein the inactive area has a circular ring shape that surrounds the inactive area, and wherein the inactive area has a top portion, a bottom portion, a left portion, and a right portion; and
display driver circuitry that includes first circuitry in the top portion that supplies data signals to columns of the pixels in a top portion of the array and that includes second circuitry in the bottom portion that supplies data signals to columns of the pixels in a bottom portion of the display, wherein the display driver circuitry includes gate driver circuitry that supplies gate lines signals to the pixels over gate lines, wherein the gate driver circuitry includes left gate driver circuitry in the left portion and right gate driver circuitry in the right portion, and wherein the gate driver circuitry lies within the circular ring shape.

11. The display defined in claim 10 wherein the first circuitry includes a first integrated circuit and wherein the second circuitry includes a second integrated circuit.

12. The display defined in claim 11 wherein the gate driver circuitry includes thin-film gate driver circuitry.

13. The display defined in claim 12 wherein the gate driver circuitry has output drivers of different strengths associated respectively with gate lines having different respective lengths.

14. A display, comprising:
a circular array of pixels forming a circular active area that displays images, wherein the circular active area is surrounded by a circular inactive area without any pixels, wherein the circular inactive area has a top portion, a bottom portion, a left portion, and a right portion, and wherein the circular array of pixels includes a top half and a bottom half; and
display driver circuitry that includes first circuitry in the top portion that supplies data signals to columns of the pixels in the top half and that includes second circuitry in the bottom portion that supplies data signals to columns of the pixels in the bottom half, wherein the display driver circuitry includes gate driver circuitry that supplies gate lines signals to the pixels over gate lines, wherein the gate driver circuitry includes left gate driver circuitry in the left portion of the circular inactive area and right gate driver circuitry in the right portion of the circular inactive area.

15. The display defined in claim 14 wherein the gate driver circuitry has output drivers of different strengths that are associated respectively with gate lines having different respective lengths.

* * * * *